United States Patent
Kim et al.

(10) Patent No.: US 12,356,840 B2
(45) Date of Patent: Jul. 8, 2025

(54) DISPLAY DEVICE

(71) Applicant: LG Display Co., Ltd., Seoul (KR)

(72) Inventors: Sungwoo Kim, Seoul (KR); Hoon Kang, Goyang-si (KR); Keongjin Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 622 days.

(21) Appl. No.: 17/467,102

(22) Filed: Sep. 3, 2021

(65) Prior Publication Data

US 2022/0208877 A1 Jun. 30, 2022

(30) Foreign Application Priority Data

Dec. 31, 2020 (KR) .................. 10-2020-0189158

(51) Int. Cl.
*H10K 59/80* (2023.01)
*H10K 50/854* (2023.01)
(Continued)

(52) U.S. Cl.
CPC ......... *H10K 59/879* (2023.02); *H10K 50/854* (2023.02); *H10K 50/858* (2023.02); *H10K 59/353* (2023.02); *H10K 59/877* (2023.02)

(58) Field of Classification Search
None
See application file for complete search history.

(56) References Cited

U.S. PATENT DOCUMENTS 8,592,833 B2 11/2013 Lee et al.
9,040,976 B2 5/2015 Lee
(Continued)

FOREIGN PATENT DOCUMENTS

JP 2017-502360 A 1/2017
KR 10-2011-0106733 A 9/2011
(Continued)

OTHER PUBLICATIONS

Korean Intellectual Property Office, Office Action, Korean Patent Application No. 10-2020-0189158, Feb. 22, 2024, 11 pages.
(Continued)

*Primary Examiner* — Steven B Gauthier
*Assistant Examiner* — E. Rhett Cheek
(74) *Attorney, Agent, or Firm* — Fenwick & West LLP

(57) ABSTRACT

A display device includes a display panel including a plurality of sub-pixel areas for respectively outputting light for displaying an image and a light travel-direction changing layer disposed on the display panel for diversifying and spreading travel directions of light emitted from each of the plurality of sub-pixel areas. The light travel-direction changing layer includes a plurality of refractive patterns respectively corresponding to the plurality of sub-pixel areas and arranged in a matrix form, and a light-scattering layer disposed around each of the plurality of refractive patterns and having a refractive index different from a refractive index of each of the plurality of refractive patterns. Due to the light travel-direction changing layer, light from each sub-pixel area is incident into each refractive pattern, is refracted at a boundary between each refractive pattern and the light-scattering layer, and is scattered in the light-scattering layer. Thus, the light emits out of the display device in the diversified and spread travel directions.

7 Claims, 10 Drawing Sheets

(51) Int. Cl.
*H10K 50/858* (2023.01)
*H10K 59/35* (2023.01)

(56) References Cited

U.S. PATENT DOCUMENTS

| | | | |
|---|---|---|---|
| 10,217,964 B2 | 2/2019 | Heo | |
| 11,217,777 B2 | 1/2022 | An et al. | |
| 11,696,468 B2 | 7/2023 | An et al. | |
| 2005/0142379 A1* | 6/2005 | Juni | G02B 5/0242 |
| | | | 428/323 |
| 2007/0153160 A1* | 7/2007 | Lee | G02F 1/133516 |
| | | | 349/95 |
| 2011/0233570 A1 | 9/2011 | Lee et al. | |
| 2012/0218173 A1* | 8/2012 | Ohta | H10K 59/8792 |
| | | | 345/76 |
| 2015/0380688 A1* | 12/2015 | Chen | H10K 59/35 |
| | | | 257/40 |
| 2016/0315287 A1* | 10/2016 | Heo | G02B 5/0242 |
| 2017/0261656 A1* | 9/2017 | Kim | G02B 25/002 |
| 2020/0066804 A1* | 2/2020 | Jung | H10K 50/858 |
| 2020/0350516 A1 | 11/2020 | An et al. | |
| 2021/0005846 A1* | 1/2021 | Kim | H10K 59/873 |
| 2021/0132422 A1* | 5/2021 | Kim | G02F 1/133528 |
| 2022/0123269 A1 | 4/2022 | An et al. | |
| 2022/0140289 A1* | 5/2022 | Tak | H10K 50/858 |
| | | | 257/40 |
| 2022/0344412 A1* | 10/2022 | Aomori | H05B 33/10 |
| 2023/0078207 A1* | 3/2023 | Kim | H10K 50/865 |
| | | | 257/40 |
| 2023/0109521 A1* | 4/2023 | Park | H10K 50/854 |
| | | | 257/40 |

FOREIGN PATENT DOCUMENTS

| | | |
|---|---|---|
| KR | 10-2015-0008574 A | 1/2015 |
| KR | 10-2017-0137683 A | 12/2017 |
| KR | 10-2020-0023864 A | 3/2020 |
| KR | 10-2020-0127103 A | 11/2020 |

OTHER PUBLICATIONS

Korean Intellectual Property Office, Notice of Allowance, Korean Patent Application No. 10-2020-0189158, Mar. 27, 2025, three pages.

* cited by examiner

DISPLAY DEVICE

CROSS-REFERENCE TO RELATED APPLICATION

The present disclosure claims priority to and the benefit of Korean Patent Application No. 10-2020-0189158, filed on Dec. 31, 2020, the disclosure of which is incorporated herein by reference in its entirety.

BACKGROUND

Field

The present disclosure relates to a display device for displaying an image.

Description of Related Art

Display devices are widely used for image display functions of various electronic devices such as mobile communication terminals, electronic notebooks, e-books, PMPs (Portable Multimedia Players), navigation systems, UMPCs (Ultra Mobile PCs), mobile phones, smart phones, tablet PCs (personal computers), watch phones, electronic pads, wearable devices, portable information devices, vehicle control display devices, televisions, notebook computers, and monitors. Research to improve the thinness, to reduce a weight, and to lower power consumption of such a display device and an electronic product having the same is continuing.

Examples of display devices include a liquid crystal display device (LCD), a plasma display device (PDP), a field emission display device (FED), an electro-wetting display device (EWD), and an electroluminescent display device (ELDD), and the like.

As, as mentioned above, an application field of the display device expands, a viewing area of the display device may not face toward a front face of the display device based on an installation position and usage scheme of an electronic device using the display device.

In one example, a user may see a display face of a watch phone only when raising a hand as well as changing a direction of a wrist or a head.

Thus, in terms of simplicity and efficiency, it is relatively natural to use the watch phone with minimal posture change such that the user does not rotate or move the head or the wrist even when the user may not see the display face of the watch phone. As a result, the user's gaze faces toward the display face of the watch phone not in a perpendicular manner but in an inclined manner.

SUMMARY

A conventional display device such as a monitor and a television displays an image for a user located in front of the display device. Accordingly, a structure capable of increasing a luminance level of light traveling frontwards is mainly applied to the conventional display device.

Therefore, depending on the electronic device to which the display device is applied, the viewing area of the display device does not face toward the display face in a perpendicular manner. In this case, there is a need for a scheme to improve an image quality of the viewing area.

Alternatively, there is a need for a scheme to expand a range of an area in which an image quality greater than or equal to a critical value is realized.

Accordingly, a purpose of the present disclosure is to provide a display device capable of diversifying a light-emission direction.

Moreover, another purpose of the present disclosure is to provide a display device that may increase an optimum critical viewing angle in which a luminance level greater than or equal to a predefined critical value is realized.

Purposes according to the present disclosure are not limited to the above-mentioned purpose. Other purposes and advantages according to the present disclosure that are not mentioned may be understood based on following descriptions, and may be more clearly understood based on embodiments according to the present disclosure. Further, it will be easily understood that the purposes and advantages according to the present disclosure may be realized using means shown in the claims and combinations thereof.

An example of the present disclosure provide a display device including a display panel including a plurality of sub-pixel areas for respectively outputting light for displaying an image and a light travel-direction changing layer disposed on the display panel for diversifying and spreading travel directions of light emitted from each of the plurality of sub-pixel areas. The light travel-direction changing layer includes: a plurality of refractive patterns respectively corresponding to the plurality of sub-pixel areas and arranged in a matrix form; and a light-scattering layer disposed around each of the plurality of refractive patterns and having a refractive index different from a refractive index of each of the plurality of refractive patterns.

Due to the light travel-direction changing layer, light from each sub-pixel area may be incident into each refractive pattern, may be refracted at a boundary between each refractive pattern and the light-scattering layer, and may be scattered in the light-scattering layer. Thus, the light may emit out of the display device in the diversified and spread travel directions. That is, the light-emission direction from the display device may be diversified.

Further, due to the diversified light-emission directions, the optimum critical viewing angle corresponding to the luminance level greater than or equal to the critical value may be increased. In other words, an area in which the image quality level greater than or equal to a critical value is realized may be extended.

According to one embodiment of the present disclosure, the light travel-direction changing layer for diversifying and spreading the travel directions of light emitted from each of the plurality of sub-pixel areas may be disposed on the display panel. The light travel-direction changing layer includes the plurality of refractive patterns corresponding to the plurality of sub-pixel areas, and the light-scattering layer disposed around each of the plurality of refractive patterns and having a refractive index different from that of each of the plurality of refractive patterns.

In this way, due to the plurality of refractive patterns respectively corresponding to the plurality of sub-pixel areas and the light-scattering layer disposed around the plurality of refractive patterns, the light from each sub-pixel area may be incident into each refractive pattern, may be refracted at a boundary between each refractive pattern and the light-scattering layer, and may be scattered in the light-scattering layer. Thus, the light may emit out of the display device in the diversified and spread travel directions. That is, the light-emission direction from the display device may be diversified.

That is, the light travel-direction changing layer may allow the light from each sub-pixel area to travel in various directions not perpendicular to the display face.

Accordingly, the light-emission directions of the display device may be diversified.

Therefore, a direction in which the light from each sub-pixel area travels may not be limited to the direction perpendicular to the display face.

Therefore, an optimum critical viewing angle in which the image is displayed at the luminance level greater than or equal to a critical value at a predefined optimum viewing distance may be increased. In other words, an area in which the image quality level greater than or equal to a critical value is realized may be extended.

Effects of the present disclosure are not limited to the above-mentioned effects, and other effects as not mentioned will be clearly understood by those skilled in the art from following descriptions.

DETAILED DESCRIPTIONS

Figure 1:
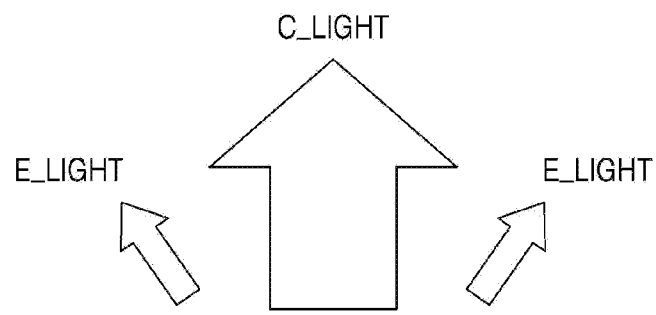
FIG. 1 is a schematic diagram showing a light-emission direction of a display device according to a comparative example.
Figure 1:
Figure 1:
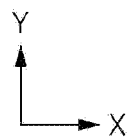

For simplicity and clarity of illustration, elements in the drawings are not necessarily drawn to scale. The same reference numbers in different drawings represent the same or similar elements, and as such perform similar functionality. Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

A shape, a size, a ratio, an angle, a number, etc. disclosed in the drawings for describing an embodiments of the present disclosure are exemplary, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The terminology used herein is for the purpose of describing particular embodiments only and is not intended to limit the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one or when preceding a list of" elements may modify the entirety of list of elements and may not modify the individual elements of the list. When referring to "C to D", this means C inclusive to D inclusive unless otherwise specified.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In addition, it will also be understood that when a first element or layer is referred to as being present "on" or "beneath" a second element or layer, the first element may be disposed directly on or beneath the second element or may be disposed indirectly on or beneath the second element with a third element or layer being disposed between the first and second elements or layers. It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like is disposed "on" or "on a top" of another layer, film, region, plate, or the like, the former may directly contact the latter or still another layer, film, region, plate, or the like may be disposed between the former and the latter.

As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In one example, when a certain embodiment may be implemented differently, a function or operation specified in a specific block may occur in a sequence different from that specified in a flowchart. For example, two consecutive blocks may actually be executed at the same time. Depending on a related function or operation, the blocks may be executed in a reverse sequence.

In descriptions of temporal relationships, for example, temporal precedent relationships between two events such as "after", "subsequent to", "before", etc., another event may occur therebetween unless "directly after", "directly subsequent" or "directly before" is not indicated. The features of the various embodiments of the present disclosure may be partially or entirely combined with each other, and may be technically associated with each other or operate with each other. The embodiments may be implemented independently of each other and may be implemented together in an association relationship. Spatially relative terms, such as "beneath," "below," "lower," "under," "above," "upper," and the like, may be used herein for ease of explanation to describe one element or feature's relationship to another element or feature as illustrated in the figures. It will be understood that the spatially relative terms are intended to encompass different orientations of the device in use or in operation, in addition to the orientation depicted in the figures. For example, when the device in the drawings is turned over, elements described as "below" or "beneath" or "under" other elements or features would then be oriented "above" the other elements or features. Thus, the example terms "below" and "under" may encompass both an orientation of above and below. The device may be otherwise oriented for example, rotated 90 degrees or at other orientations, and the spatially relative descriptors used herein should be interpreted accordingly.

"X axis direction", "Y axis direction" and "Z axis direction" should not be interpreted only to have a geometric relationship in which the X axis direction, the Y axis direction, and the Z axis direction are perpendicular to each other. "X axis direction", "Y axis direction" and "Z axis direction" may be interpreted to have a broader direction within a range in which components herein may work functionally.

First, a display device according to a comparative example different from one embodiment of the present disclosure will be described.

Figure 2:
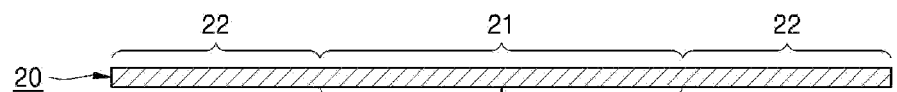
FIG. 2 is a schematic diagram of a viewing area according to the comparative example of FIG. 1.
Figure 2:
Figure 2:
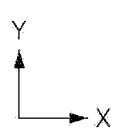

FIG. 1 is a schematic diagram showing a light-emission direction of a display device according to a comparative example. FIG. 2 is a schematic diagram of a viewing area according to the comparative example of FIG. 1.

As shown in FIG. 1, a display device REF according to the comparative example may emit the largest amount of light C_LIGHT (Center Light) in a direction (Y-axis direction) perpendicular to a display face parallel to X-axis direction due to straightness of a light travel direction, and emit a relatively small amount of light E_LIGHT (Edge Light) in a direction inclined to the display face.

Thus, as shown in FIG. 2, an optimum viewing area which is spaced from the display device REF by a predefined optimum viewing distance OVD and in which an image display may be implemented at a luminance level greater than or equal to a critical value may be limited to a central area 21 facing toward a display face of the display device REF in a visible area 20 in which at least a portion of the display device REF may be recognized.

Moreover, in a side area 22 arranged on each of both opposing sides of the central area 21 of the visible area 20, only a portion of the display face may be observed, or at least a portion of the display face may be recognized at a luminance level lower than the critical luminance That is, the display quality in the side area 22 that does not face toward the display device REF in a perpendicular manner thereto may be significantly lower than that in the central area 21.

However, as the application range of the display device expands, a display device capable of providing the improved display quality even when the user's gaze does not face the front of the display device in a perpendicular manner thereto is required.

Thus, each embodiment of the present disclosure provides a display device capable of expanding a range of the optimum viewing area.

Figure 3:
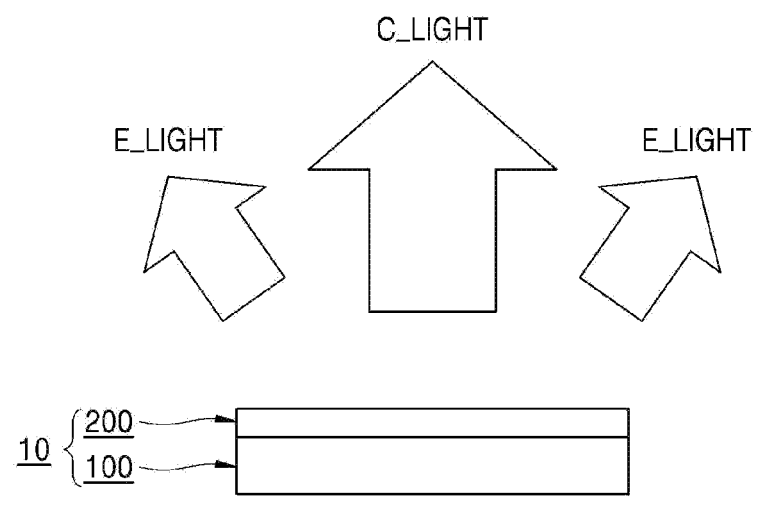
FIG. 3 is a drawing showing a display device according to one embodiment of the present disclosure.
Figure 4:
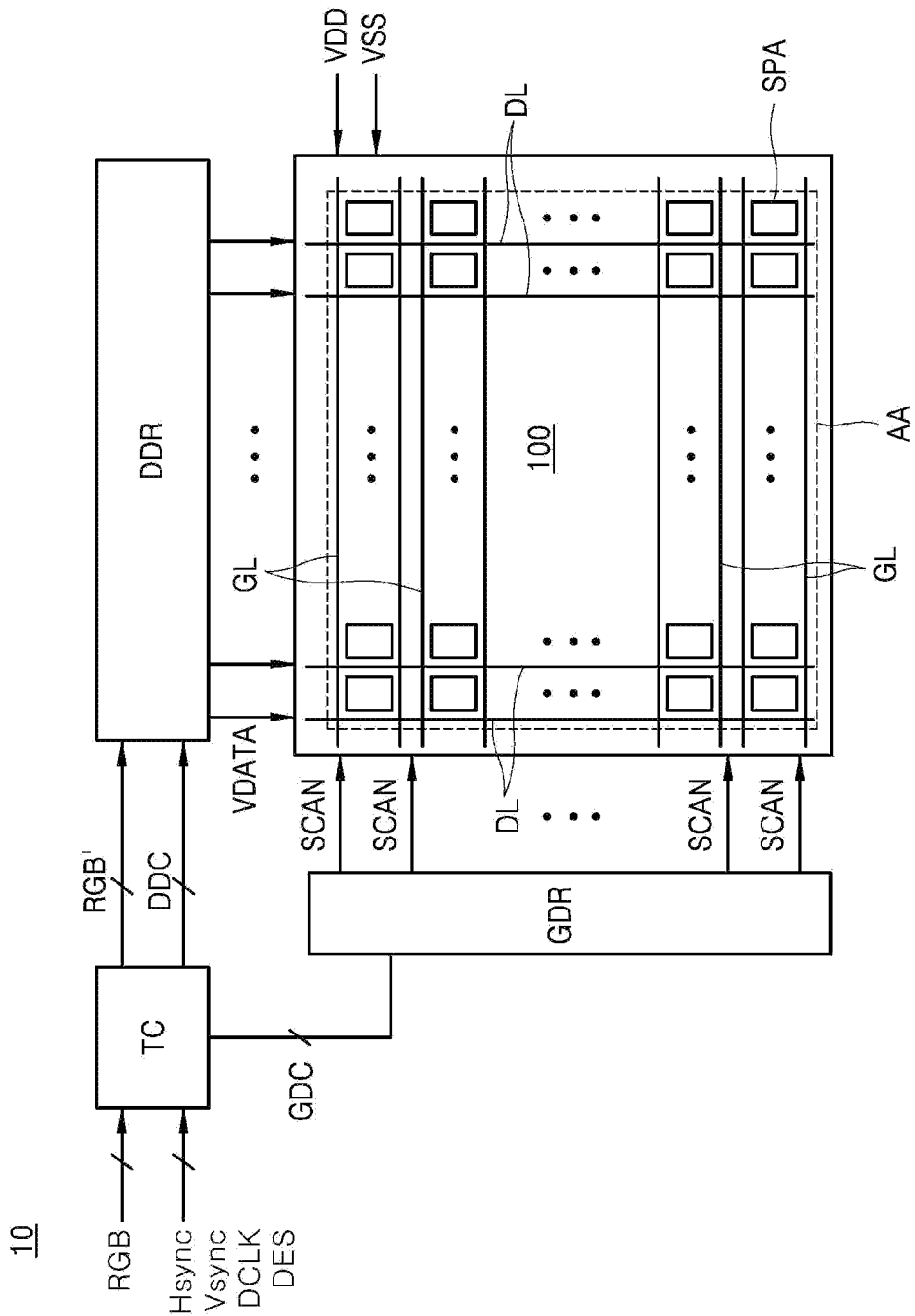
FIG. 4 is a drawing showing a display panel and a panel driver of FIG. 3.
Figure 5:
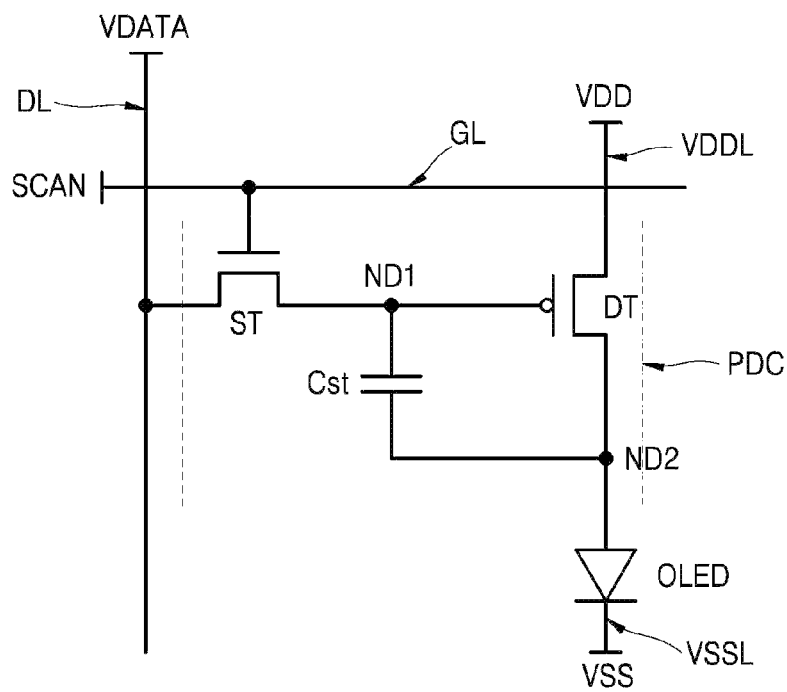
FIG. 5 is a drawing showing an example of an equivalent circuit corresponding to a sub-pixel area of FIG. 4.
Figure 6:
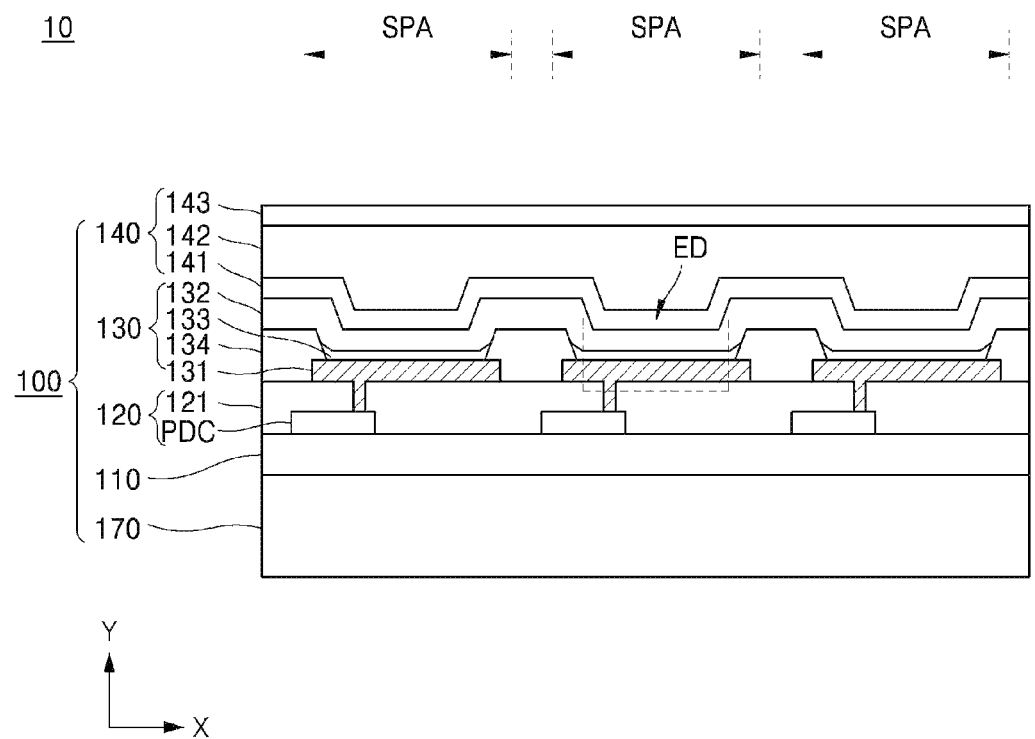
FIG. 6 is a drawing showing an example of a portion of the display panel in
FIG. 4.

FIG. 3 is a drawing showing a display device according to one embodiment of the present disclosure. FIG. 4 is a drawing showing a display panel and a panel driver of FIG. 3. FIG. 5 is a drawing showing an example of an equivalent circuit corresponding to a sub-pixel area of FIG. 4. FIG. 6 is a drawing showing an example of a portion of a display panel in FIG. 4.

Figure 7:
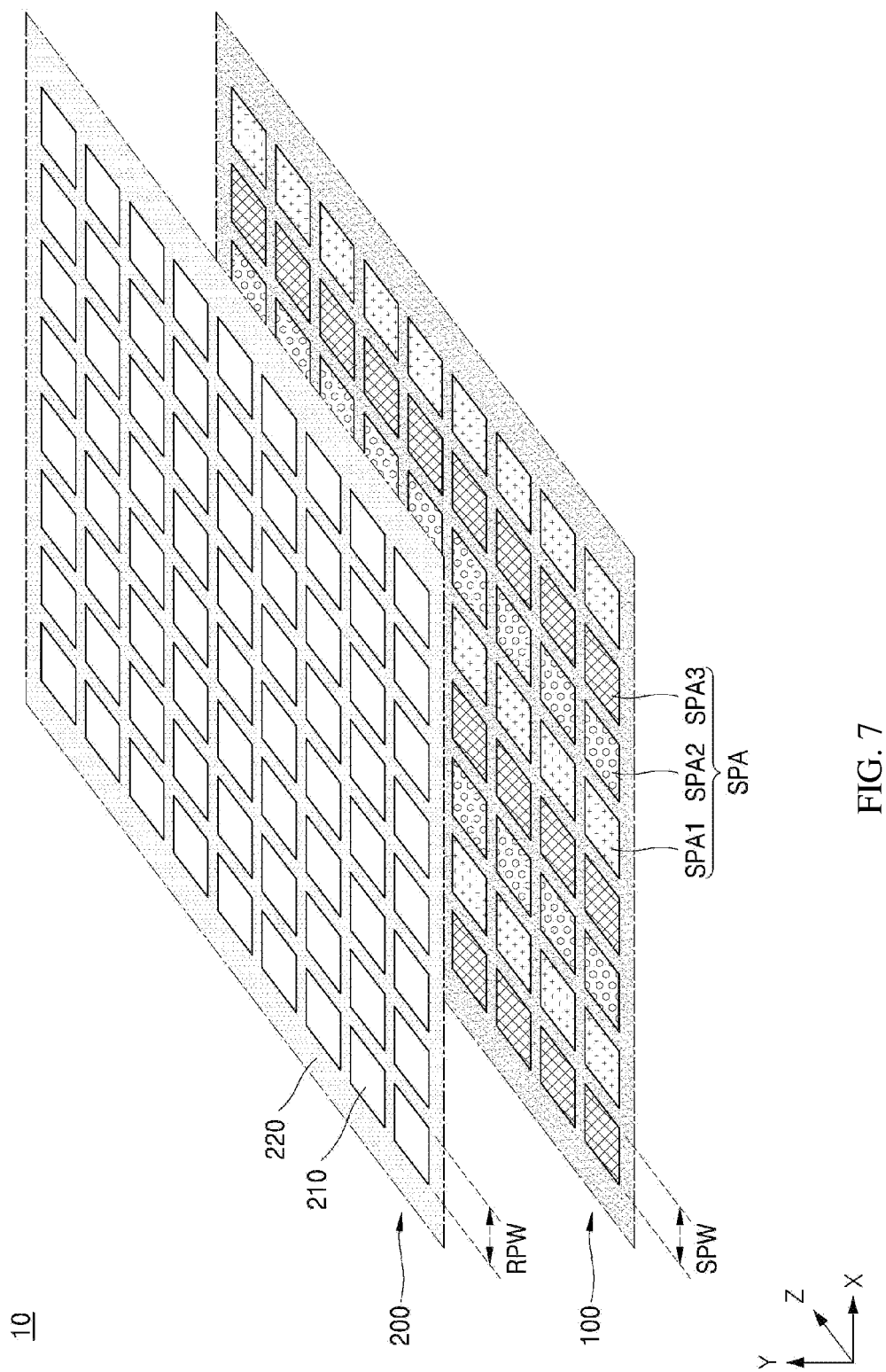
FIG. 7 is a drawing showing a display panel and a light travel-direction changing layer as components of the display device in FIG. 3.

FIG. 7 is a drawing showing a display panel and a light travel-direction changing layer as components of the display device in FIG. 3.

As shown in FIG. 3, a display device 10 according to one embodiment of the present disclosure includes a display panel 100 including a plurality of sub-pixel areas (SPA in FIG. 4 and FIG. 7) that respectively emit light for displaying an image, and a light travel-direction changing layer 200 disposed on the display panel 100.

The light travel-direction changing layer 200 diversifies and spreads travel directions of light emitted from each of the plurality of sub-pixel areas SPA. The light travel-direction changing layer 200 will be described in detail below.

As described above, the display device 10 according to one embodiment of the present disclosure may include the light travel-direction changing layer 200 and thus may diversify and spread the travel directions of light emitted from the plurality of sub-pixel areas SPA. Accordingly, the display device 10 may emit light C_LIGHT at a predetermined luminance in a direction perpendicular to the display face, while emitting light E_LIGHT at a predetermined luminance in a direction inclined to the display face. In this connection, the predetermined luminance represents a level in a luminance range greater than or equal to the critical value.

As shown in FIG. 4, the display panel 100 includes a display area AA in which an image display is implemented, a plurality of sub-pixel areas SPA arranged in the display area AA, and signal lines GL and DL connected to the plurality of sub-pixel areas SPA. The signal lines GL and DL of the display panel 100 may transmit a drive signal supplied from a panel driver TC, GDR, and DDR to each sub-pixel area SPA.

The signal lines GL and DL of the display panel 100 may include a gate line GL transmitting a scan signal SCAN of the gate driver GDR, and a data line DL transmitting a data signal VDATA of the data driver DDR.

When the display panel 100 includes a light-emissive element (not shown) corresponding to each sub-pixel area SPA, the display panel 100 may further include first and second driving power lines for respectively transmitting first and second driving powers VDD and VSS, respectively, for the operation of the light-emissive element.

The panel driver TC, GDR, and DDR may include the gate driver GDR connected to the gate line GL of display panel 100, the data driver DDR connected to the data line DL of the display panel 100, and a timing controller TC for controlling an operation timing of each of the gate driver GDR and the data driver DDR.

The timing controller TC rearranges digital video data RGB input from an external system based on a resolution of the display panel 100, and supplies the rearranged digital video data RGB' to the data driver DDR.

The timing controller TC may generate and supply a data control signal DDC to control the operation timing of the data driver DDR, and a gate control signal GDC to control the operation timing of the gate driver GDR, based on timing signals such as a vertical synchronization signal Vsync, a horizontal synchronization signal Hsync, a dot clock signal DCLK, and a data enable signal DES.

The gate driver GDR sequentially supplies a scan signal SCAN to a plurality of gate lines GLs during one frame period for displaying an image based on the gate control signal GDC. That is, the gate driver GDR supplies a scan signal SCAN to each gate line GL during each horizontal period corresponding to each gate line GL during one frame period. In this connection, the gate line GL may correspond to sub-pixel areas SPA arranged in a line in a horizontal direction among the plurality of sub-pixel areas SPA.

The data driver DDR converts the rearranged digital video data RGB' into an analog data voltage based on the data control signal DDC. The data driver DDR supplies, to the data line DL, a data signal VDATA corresponding to each of the sub-pixel areas SPA corresponding to each gate line GL during each horizontal period based on the rearranged digital video data RGB'.

As shown in FIG. 5, each sub-pixel area SPA includes a light-emissive element OLED, and a pixel driver circuit PDC for supplying a drive signal to the light-emissive element OLED.

In one example, the pixel driver circuit PDC includes a driving transistor DT, a switching transistor ST, and a storage capacitor Cst.

In addition, although not shown in FIG. 5, each sub-pixel area SPA may further include a compensation circuit (not shown) for compensating for deterioration of at least one of the driving transistor DT and the light-emissive element OLED. The compensation circuit may include at least one transistor (not shown) to detect a deterioration amount or to supply a reference power (not shown).

The driving transistor DT may be connected in series to the light-emissive element OLED and may be disposed between a first driving power line VDDL supplying a first driving power VDD and a second driving power line VSSL supplying a second driving power VSS with a lower potential than that of the first driving power VDD.

That is, one end of the driving transistor DT is connected to the first driving power line VDDL, while the opposite end of the driving transistor DT is connected to one end of the light-emissive element OLED. Moreover, the opposite end of the light-emissive element OLED is connected to the second driving power line VSSL.

The switching transistor ST is disposed between a first node ND1 and the data line DL supplying the data signal VDATA of each sub-pixel area SPA. The first node ND1 is a contact point between a gate electrode of the driving transistor DT and the switching transistor ST. Moreover, a gate electrode of the switching transistor ST is connected to the gate line GL.

The storage capacitor Cst is disposed between the first node ND1 and a second node ND2. The second node ND2 is a contact point between the driving transistor DT and the light-emissive element OLED.

An operation of this pixel driver circuit PDC is as follows.

The switching transistor ST is turned on based on the scan signal SCAN of the gate line GL. In this connection, the data signal VDATA of the data line DL is supplied to the gate electrode of the driving transistor DT and the storage capacitor Cst via the turned-on switching transistor ST and the first node ND1.

The storage capacitor Cst is charged with the data signal VDATA.

Moreover, the driving transistor DT is turned on based on the data signal VDATA and the charged voltage of the storage capacitor Cst to generate a drive current corresponding to the data signal VDATA. Accordingly, the drive current resulting from the turned-on driving transistor DT may be supplied to the light-emissive element OLED.

As shown in FIG. 6, the display panel 100 may include a support substrate 110, a transistor array 120 disposed on the support substrate 110, a light-emitting array 130 disposed on the transistor array 120, and an encapsulation film 140 disposed on the light-emitting array 130.

The support substrate 110 may be made of a flexible insulating material. In one example, the support substrate 110 may be made of one of PI (polyimide), PC (polycarbonate), PET (polyethyleneterephthalate), PMP (polymethylpentene), PMMA (polymethylmethacrylate), PNB (polynorbornene), PEN (polyethylenapthanate), PES (polyethersulfone), and COS (cycloolefin copolymer).

The transistor array 120 includes a pixel driver circuit (PDC of FIG. 5) corresponding to each of the plurality of sub-pixel areas SPA. As shown in FIG. 5, the pixel driver circuit PDC may include the driving transistor DT connected to the light-emissive element OLED, the switching transistor ST which is turned on and off based on the scan signal of the gate line GL and delivers the data signal VDATA of the data line DL to the gate electrode of the driving transistor DT, and the storage capacitor Cst connected to the gate electrode of the driving transistor DT. The transistor array 120 further includes signal lines GL and DL connected to the pixel driver circuit PDC of each sub-pixel area SPA.

The transistor array 120 may further include a planarization film 121 disposed on the support substrate 110 and covering the pixel driver circuit PDC in a planarized manner.

The light-emissive array 130 may be disposed on the planarization film 121 of the transistor array 120.

The light-emissive array 130 may include a light-emissive element ED (OLED in FIG. 5) corresponding to each of the plurality of sub-pixel areas SPA.

Each light-emissive element ED may include a first electrode 131 and a second electrode 132 facing away each other, and a light-emissive structure 133 disposed therebetween.

In one example, the light-emitting array 130 may include the first electrode 131 disposed on the planarization film 121 and corresponding to each sub-pixel area SPA, a bank 134 which is disposed on the planarization film 121, corresponds to an outer edge of each sub-pixel area SPA, and covers an edge of the first electrode 131, a light-emissive structure 133 disposed on the first electrode 131, and the second electrode 132 disposed on the bank 134 and the light-emissive structure 133.

The encapsulation film 140 is disposed on the light-emitting array 130 to seal the light-emitting array 130.

The encapsulation film 140 may have a structure in which a plurality of protective films 141, 142, and 143 made of different insulating materials or having different thicknesses are sequentially stacked.

In one example, the plurality of protective films 141, 142, and 143 may include a first protective film 141 which covers the second electrode 132 and is made of an inorganic insulating material, a second protective film 141 disposed on the first protective film 141 in a planarized manner and made of an organic insulating material, and a third protective film 143 disposed on the second protective film 142 and made of an inorganic insulating material.

This encapsulation film 140 may delay invasion of moisture or oxygen into the light-emitting array 130. Thus, influence of foreign material thereon may be reduced.

An auxiliary substrate 170 may be intended for reinforcing the support substrate 110 and may be omitted depending on a material of the support substrate 110.

As shown in FIG. 7, the display device 10 according to one embodiment may include the display panel 100 including a plurality of sub-pixel areas SPA which are arranged in a matrix form and respectively output light for displaying an image, and the light travel-direction changing layer 200 disposed on the display panel 100 for diversifying and spreading the travel directions of light emitted from each of the plurality of sub-pixel areas SPA.

The display panel 100 includes the display area (AA in FIG. 4) where the image display is implemented, and includes the plurality of sub-pixel areas SPA arranged in a matrix and in the display area AA. Each sub-pixel area SPA emits light at a luminance level corresponding to the image.

When the display panel 100 displays a color image, each of the plurality of sub-pixel areas SPA emits light in a wavelength range corresponding to one of a plurality of different colors. In this connection, the plurality of colors may include red, green, and blue. That is, the plurality of sub-pixel areas SPA may include a first sub-pixel area SPA1 corresponding to red, a second sub-pixel area SPA2 corresponding to green, and a third sub-pixel area SPAS corresponding to blue. Alternatively, the plurality of colors may further include white. To this end, the display panel 100 may include a color filter (not shown).

The light travel-direction changing layer 200 may include the plurality of refractive patterns 210 which respectively correspond to the plurality of sub-pixel areas SPA and is arranged in a matrix form, and the light-scattering layer 220 which surrounds each of the plurality of refractive patterns 210 and has a different refractive index from that of each of the plurality of refractive patterns 210.

A width RPW (Refraction Pattern Width) of each of the plurality of refractive patterns 210 may be larger than a width SPW (Sub-Pixel Width) of each of the sub-pixel areas SPA. In this way, a larger portion of the light emitted from each sub-pixel area SPA may be incident to each refractive pattern 210 in which the light may be converted to have diversified travel directions. That is, a percentage of an amount of light converted to have the diversified travel directions relative to a total amount of light emitted from each sub-pixel area SPA may be increased.

The light-scattering layer 220 may include a transparent resin material 221, and particles 222 dispersed in the transparent resin material 221. The light-scattering layer 220 scatters light refracted at the boundary between each refractive pattern 210 and the light-scattering layer 220, such that the light travel directions may be further spread.

The light-scattering layer 220 may have a refractive index lower than that of each of the plurality of refractive patterns 210. In this way, a percentage of light lost due to a total reflection at the boundary between each refractive pattern 210 and the light-scattering layer 220 may be reduced.

When the light from each sub-pixel area SPA is incident into each refractive pattern 210 of this light travel-direction changing layer 200, the light may be refracted at a predefined angle at the boundary between each refractive pattern 210 and the light-scattering layer 220, and then may be scattered in the light-scattering layer 220, and thus may emit out of the display device 10 in various travel directions.

Figure 8:
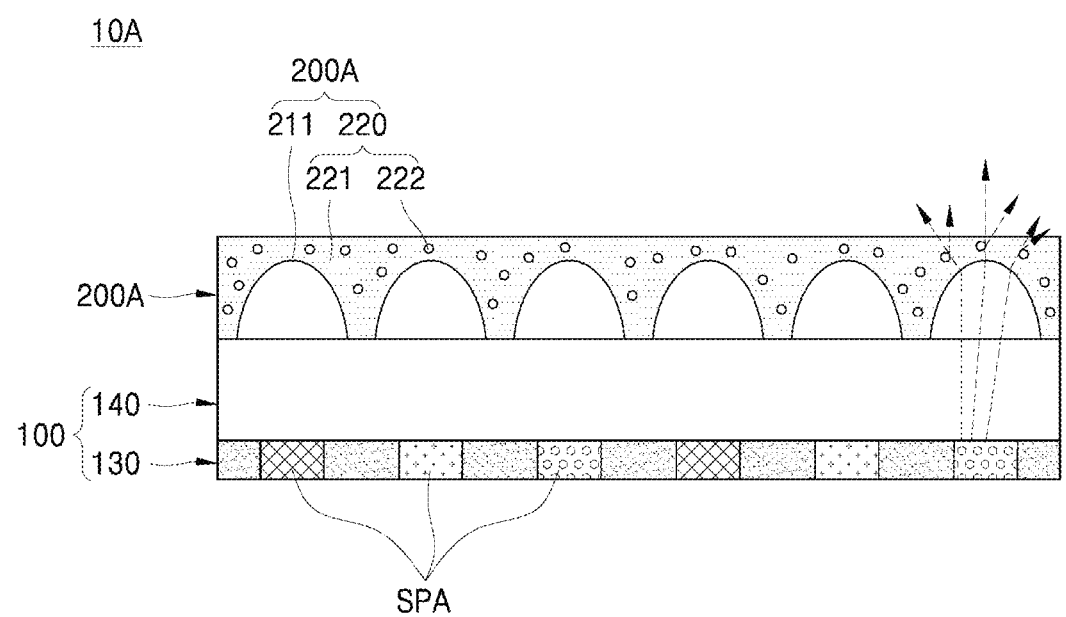
FIG. 8 is a drawing showing a light travel-direction changing layer according to a first embodiment of the present disclosure.
Figure 9:
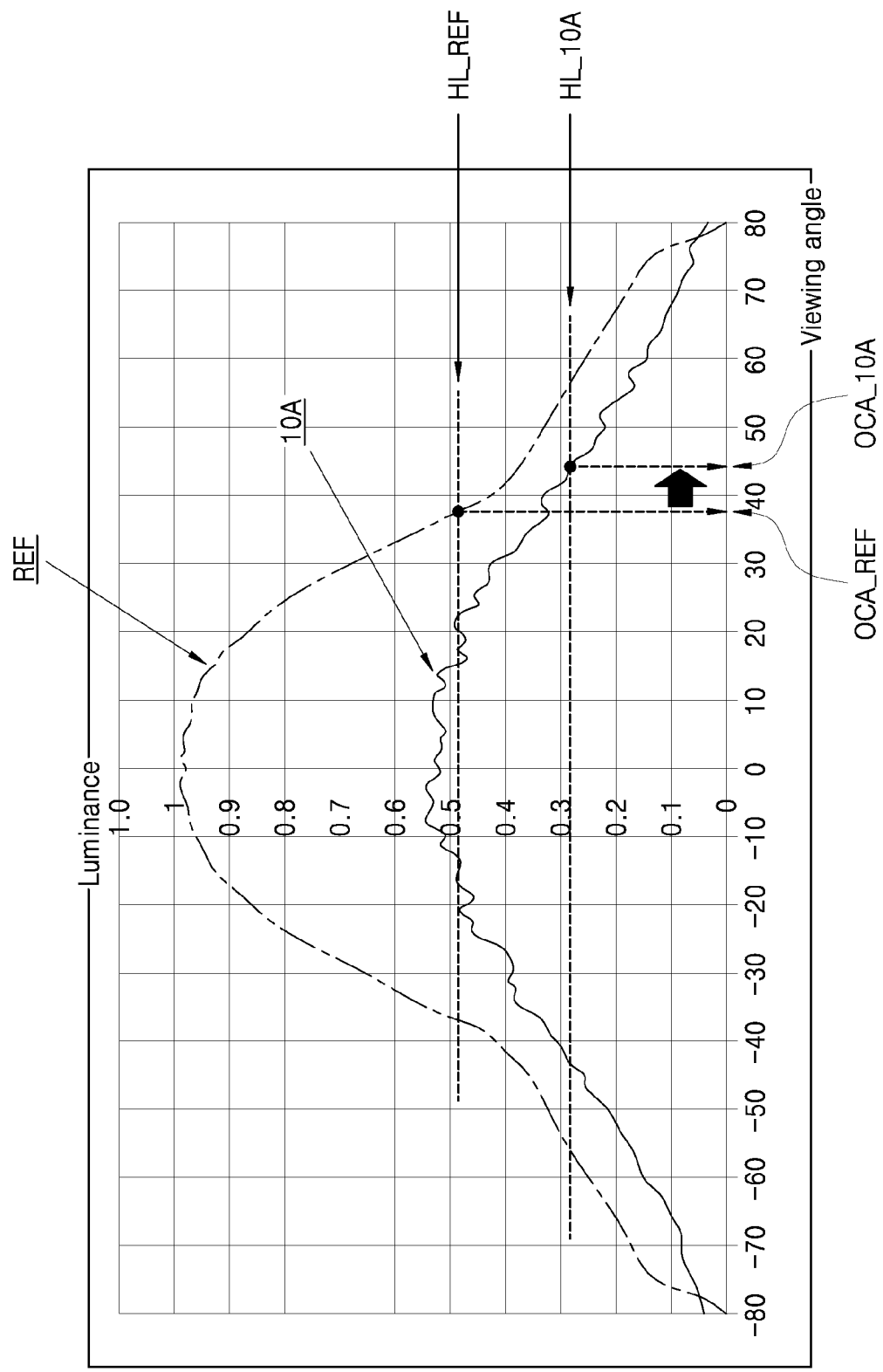
FIG. 9 is a drawing showing simulation results about a viewing angle-based luminance level according to the comparative example and the first embodiment.

Next, the light travel-direction changing layer 200 according to each embodiment of the present disclosure will be described. FIG. 8 is a drawing showing a light travel-direction changing layer according to a first embodiment of the present disclosure. FIG. 9 is a drawing showing simulation results about a viewing angle-based luminance level according to the comparative example and the first embodiment. For reference, the comparative example REF in FIG. 9 exemplifies a structure that does not include the light travel-direction changing layer disposed on the encapsulation film 140 of the display panel 100.

As shown in FIG. 8, each of a plurality of refractive patterns 211 provided in a light travel-direction changing layer 200A of a display device 10A according to the first embodiment of the present disclosure may be formed in a lens shape.

The light-scattering layer 220 is disposed to cover the plurality of refractive patterns 211 in a planarized manner (i.e., a top face of the light-scattering layer 220 is planarized). The light-scattering layer 220 includes particles 222 dispersed therein. Thus, the light refracted from the refractive pattern 211 toward the light-scattering layer 220 may encounter the particles 222 and thus may be scattered thereby.

In this connection, the light-scattering layer 220 has a refractive index lower than that of the refractive pattern 211. Thus, even when the light-scattering layer 220 is disposed to cover the refractive pattern 211, it is expected that light loss resulting from the light-scattering layer 220 may not increase significantly.

Alternatively, a thickness of the light-scattering layer 220 may be the same as that of the refractive pattern 211 so that the light-emission face of the refractive pattern 211 is not covered with the light-scattering layer 220.

Thus, according to the first embodiment, the light from each sub-pixel area SPA may be incident into each refractive pattern 211, may be refracted at the boundary between each refractive pattern 211 and the light-scattering layer 220, and then, may be scattered by the particles 222 distributed in the light-scattering layer 220. Thus, the light may emit out of the display device 10A in various travel directions.

Accordingly, as shown in FIG. 9, it may be identified that an optimum critical viewing angle OCA_10A in the display device 10A according to the first embodiment is larger than that the optimum critical viewing angle OCA_REF in the comparative example. In this connection, the optimum critical viewing angle OCA may refer to a critical value of a viewing angle corresponding to a predefined optimum luminance level HL_REF and HL_10A. The optimum luminance level HL_REF and HL_10A may be specified as 50% (HL: Half Luminance) of the highest luminance.

However, each of the plurality of refractive patterns 211 provided in the light travel-direction changing layer 200A according to the first embodiment has a convex lens shape convex in a direction in which light emits. Accordingly, the light from each sub-pixel area SPA may be incident to each refractive pattern 211 and be refracted at the boundary between each refractive pattern 211 and the light-scattering layer 220 so as to be scattered in all directions. Thus, light loss may be increased.

That is, as shown in FIG. 9, the highest luminance (about 0.55 in the vertical axis of FIG. 9) in the display device 10A according to the first embodiment is lowered to about 50% of that (about 1 in the vertical axis of FIG. 9) in the comparative example REF. Thus, the optimum luminance level HL_10A (about 0.3 in the vertical axis of FIG. 9) according to the first embodiment is lowered to about 50% of that HL_REF (about 0.5 in the vertical axis of FIG. 9) in the comparative example.

For this reason, the present disclosure provides a second embodiment of the light travel-direction changing layer.

Figure 10:
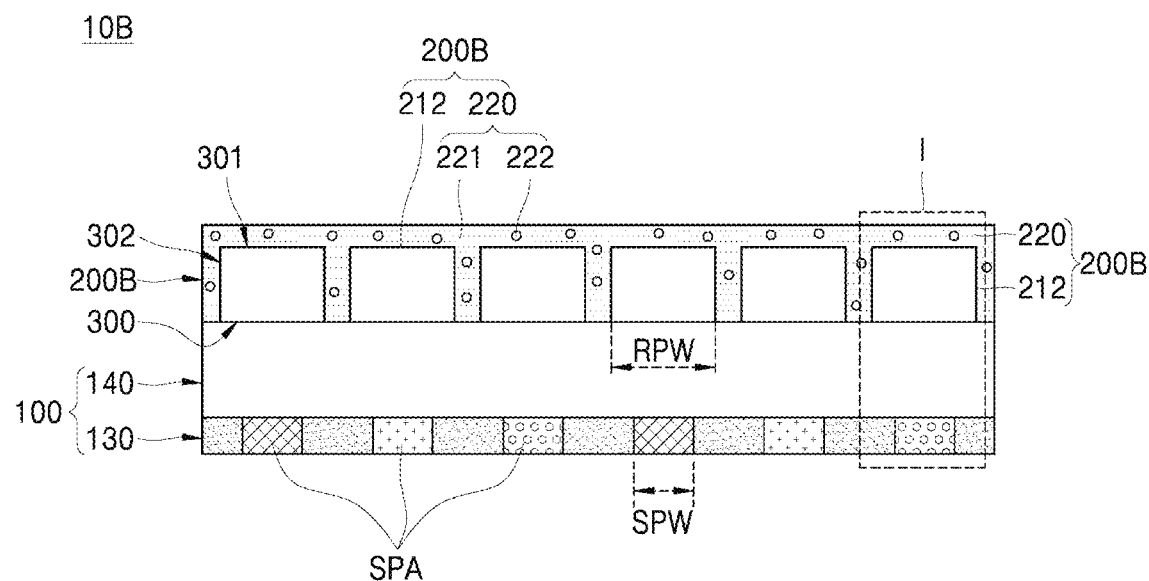
FIG. 10 is a drawing showing a light travel-direction changing layer according to a second embodiment of the present disclosure.
Figure 11:
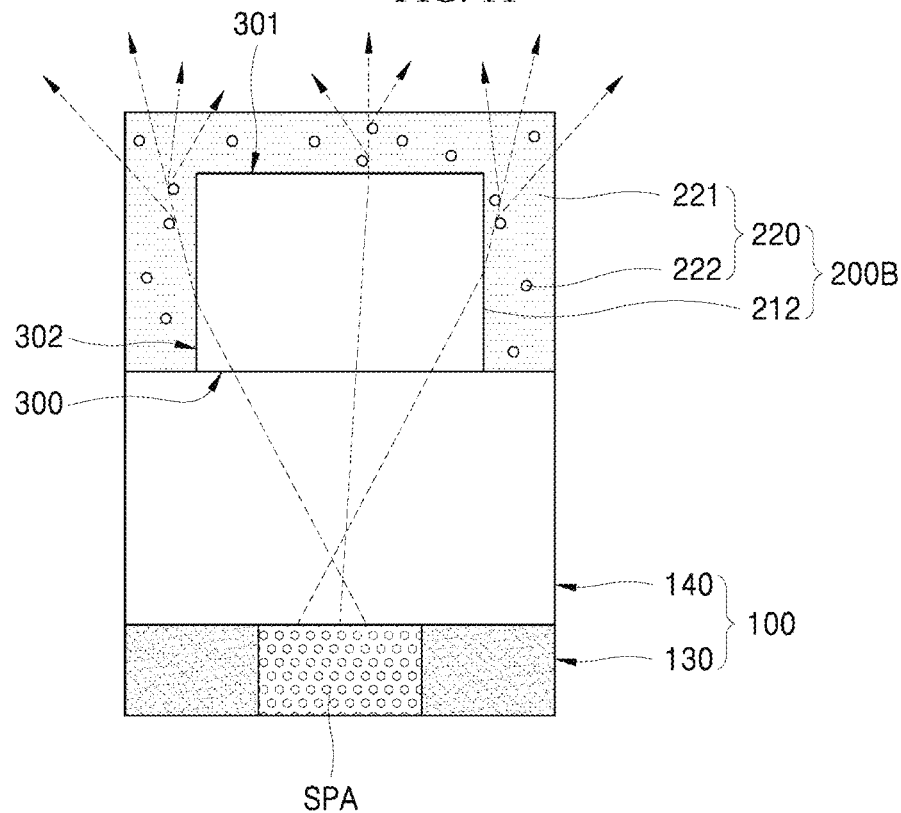
FIG. 11 is a schematic diagram showing an example of a light travel direction in an I portion of FIG. 10.
Figure 12:
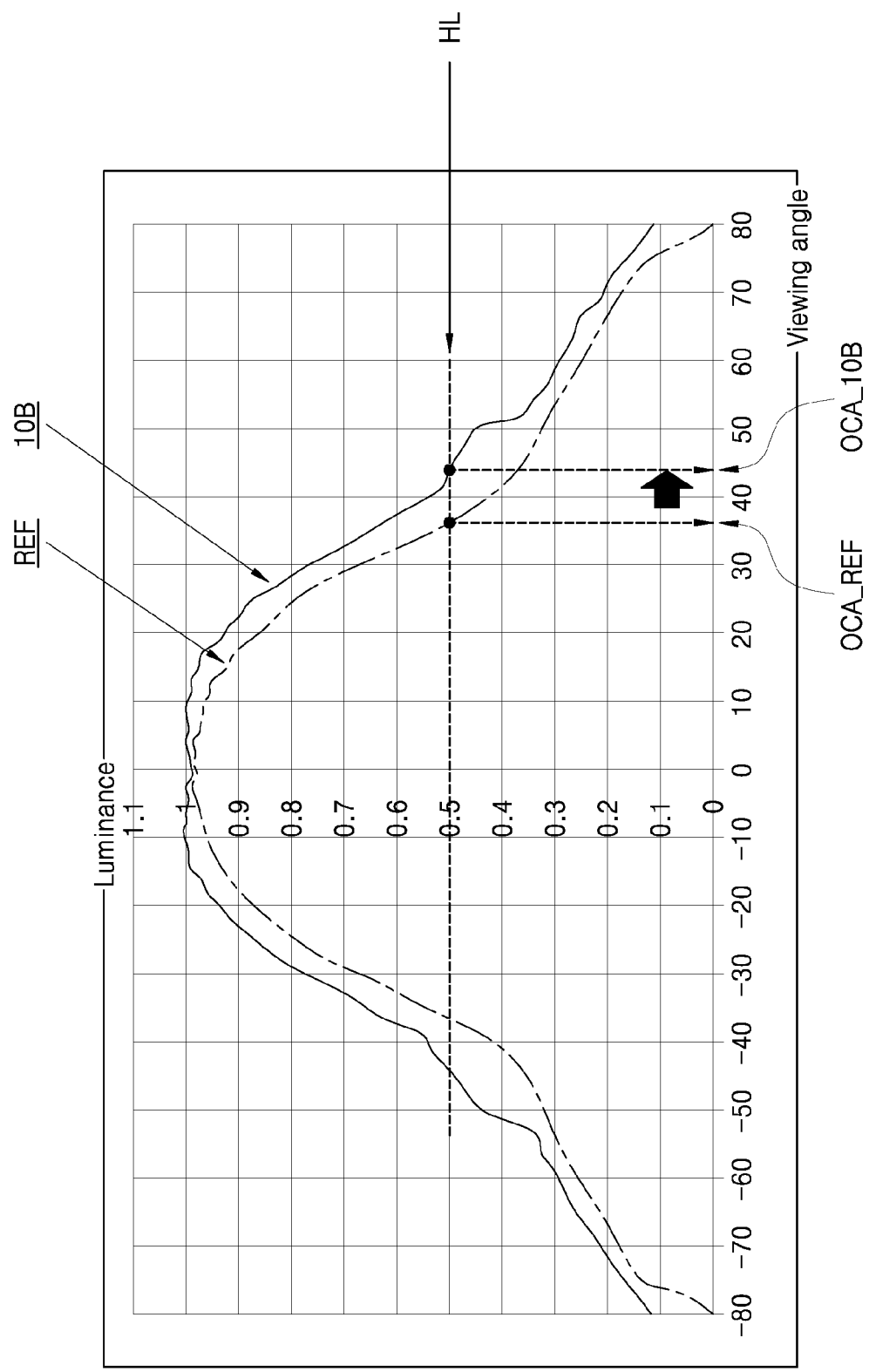
FIG. 12 is a drawing showing simulation results for a viewing angle-based luminance level according to the comparative example and the second embodiment.

FIG. 10 is a drawing showing the light travel-direction changing layer according to the second embodiment of the present disclosure. FIG. 11 is a schematic diagram showing an example of a light travel direction in a portion I of FIG. 10. FIG. 12 is a drawing showing simulation results about a viewing angle-based luminance level according to the comparative example and the second embodiment.

As shown in FIG. 10, each of a plurality of refractive patterns 212 provided in a light travel-direction changing layer 200B of a display device 10B according to the second embodiment of the present disclosure is formed in a column shape.

A light incident face 300 of each refractive pattern 212 having the column shape may be a bottom face thereof facing toward the sub-pixel area SPA, while a light-emission face 301 thereof may be a top face facing toward the viewing area.

A width RPW of the light incident face 300 of each refractive pattern 212 is greater than a width SPW of each sub-pixel area SPA.

Moreover, the light-emission face 301 of each refractive pattern 212 has substantially the same shape as a shape of each sub-pixel area SPA in a plan view of the display device. In other words, the light-emission face 301 of each refractive pattern 212 has the same shape as that of each sub-pixel area SPA in a plan view and has a size greater than that of each sub-pixel area SPA.

The light-incident face 300 of each refractive pattern 212 having the column shape has substantially the same shape as a shape of each sub-pixel area SPA in a plan view of the display device.

That is, the light incident face 300 and the light-emission face 301 of each refractive pattern 212 are parallel to each other and resemble each other. In other words, the light incident face 300 and the light-emission face 301 have the same shape.

The light incident face 300 and the light-emission face 301 may have the same size. Alternatively, for light control using the refractive pattern 212, the light incident face 300 and the light-emission face 301 may have different sizes.

In particular, the light-emission face 301 of each refractive pattern 212 may have the same shape as that of a light-emissive element that substantially emits light in each sub-pixel area SPA and may have a larger width than that of the light-emissive element of each sub-pixel area SPA.

In this way, an area in which light from each sub-pixel area SPA emits from the display device 10B may be extended to an area corresponding to each refractive pattern 212 rather than to each sub-pixel area SPA.

Further, since each refractive pattern 212 is formed in the column shape, the refractive properties on a side face 302 thereof may be relatively uniform. In each refractive pattern 212, the side face 302 is disposed between the light incident face 300 and the light-emission face 301.

That is, as shown in FIG. 11, a side face 302 of each refractive pattern 212 extends in a direction parallel to a direction in which light from the sub-pixel area SPA emits, that is, a direction perpendicular to the encapsulation film 140. Accordingly, light refracted at a boundary between the side face 302 of each refractive pattern 212 and the light-scattering layer 220 has a travel direction toward the light-emission face 301 of each refractive pattern 212. Therefore, an area in which the light from each sub-pixel area SPA emits out of the display device 10B may increase to a sum of an area of each refractive pattern 212 larger than each sub-pixel area SPA, and an area around each refractive pattern 212.

Accordingly, a viewing angle range in which the display device 10B according to the second embodiment provides light at the highest luminance, that is, the optimum viewing area may be increased.

That is, as illustrated in FIG. 12, it may be identified that the optimum viewing area according to the comparative example REF is only a viewing angle range of around 0, while the optimum viewing area of the display device 10B according to the second embodiment is a viewing angle range of about −10 degrees to about +10 degrees.

Further, the optimum critical viewing angle OCA in the display device 10B according to the second embodiment may be larger than that in the comparative example REF.

That is, as shown in FIG. 12, it may be identified that the optimum critical viewing angle OCA_REF according to the comparative example REF is about 37 degrees, while the optimum critical viewing angle OCA_10B in the display device 10B according to the second embodiment is about 44 degrees which is a value greater than the optimum critical viewing angle OCA_REF according to the comparative example REF.

Further, according to the second embodiment of the present disclosure, due to the refractive pattern 212 having the column shape, the light is refracted at the boundary between the refractive pattern 212 and the light-scattering layer 220 not so that the light is scattered in all directions but so that the light is directed upwardly of the light-emission face 301 of refraction pattern 212.

Therefore, as shown in the example in FIG. 12, the maximum luminance (about 1 in the vertical axes in FIG. 12) in the display device 10B according to the second embodiment may be prevented from being lowered to a value lower than the maximum luminance (about 1 in the vertical axes in FIG. 12) in the comparative example REF.

In one example, a refractive angle of light may be adjusted at the boundary between the refractive pattern 212 and the light-scattering layer 220, based on a principle that a refractive angle of light corresponds to an incident angle of light.

Figure 13:
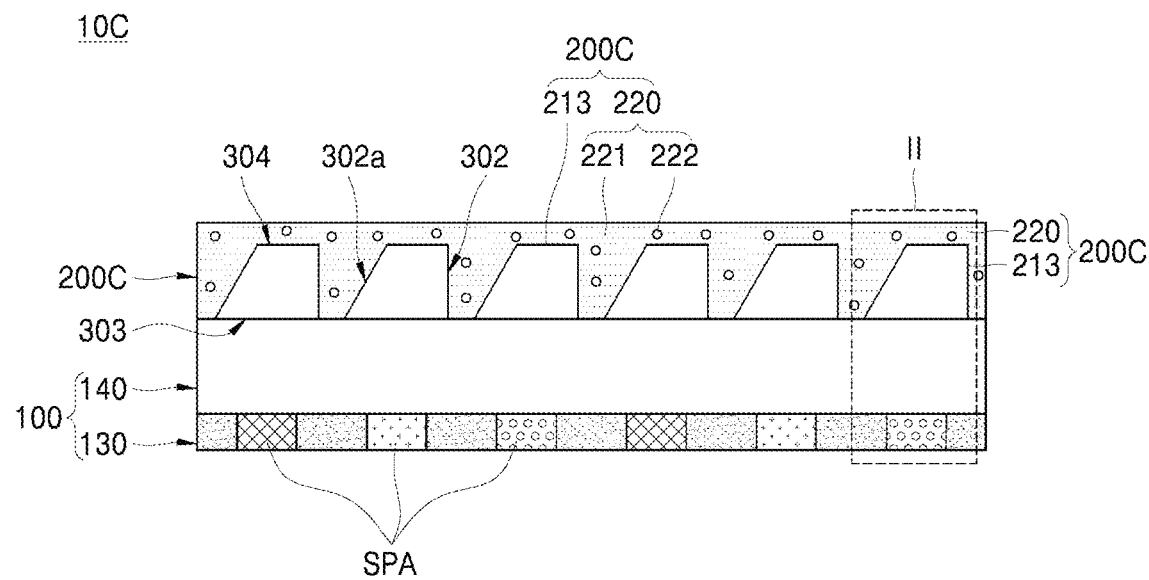
FIG. 13 is a drawing showing a light travel-direction changing layer according to a third embodiment of the present disclosure.
Figure 14:
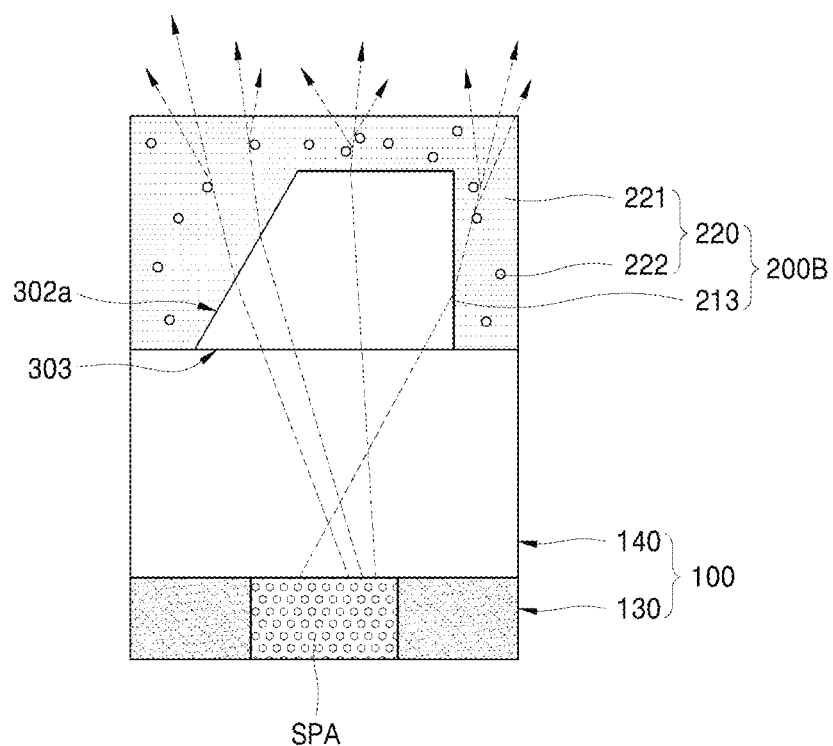
FIG. 14 is a schematic diagram showing an example of a light travel direction in a portion II of FIG. 13.

FIG. 13 is a drawing showing a light travel-direction changing layer according to a third embodiment of the present disclosure. FIG. 14 is a schematic diagram showing an example of a light travel direction in a portion II of FIG. 13.

As shown in FIG. 13, each of a plurality of refractive patterns 213 provided in a light travel-direction changing layer 200C of a display device 10C according to the third embodiment of the present disclosure is the same as that in the second embodiment of FIG. 10 and FIG. 11, except that at least a portion of a side face 302a of each of the plurality of refractive patterns 213 is inclined relative to a light incident face 303 thereof. Thus, hereinafter, duplicate descriptions therebetween are omitted.

In one example, as shown in FIG. 13, a portion of the side face 302a of each refractive pattern 213 facing toward one side edge in a horizontal direction of the visible area 20 (shown in FIG. 2) is inclined.

Alternatively, although not shown separately, portions of the side face of each refractive pattern 213 respectively facing toward both opposing edges in a horizontal direction of the display area AA may be inclined.

Alternatively, although not shown separately, portions of the side face of each refractive pattern 213 respectively facing toward both opposing edges in a vertical direction of the display area AA may be inclined.

As shown in FIG. 14, the light is refracted at a portion (a right side face of FIG. 14) of the side face 302 of each refractive pattern 213 according to the third embodiment perpendicular to the light incident face 303 such that the light travels in a direction closer to the light-emission face 304, while the light is refracted at a portion (a left side face of FIG. 14) of the side face 302a of each refractive pattern 213 according to the third embodiment inclined to the light incident face 303 such that the light travels in a direction far away from the light-emission face 304.

In this way, the refractive characteristics of light in at least a portion of the side face of each refractive pattern 213 may be different from the refractive characteristics of light in the remaining portion of the side face of each refractive pattern 213. Thus, the display quality in one partial side of the visible area 20 may be adjusted to be different from the display quality in the other partial side of the visible area 20.

Although the embodiments of the present disclosure have been described in more detail with reference to the accompanying drawings, the present disclosure is not necessarily limited to these embodiments. The present disclosure may be implemented in various modified manners within the scope not departing from the technical idea of the present disclosure. Accordingly, the embodiments disclosed in the present disclosure are not intended to limit the technical idea of the present disclosure, but to describe the present disclosure. the scope of the technical idea of the present disclosure is not limited by the embodiments. Therefore, it should be understood that the embodiments as described above are illustrative and non-limiting in all respects. The scope of protection of the present disclosure should be interpreted by the claims, and all technical ideas within the scope of the present disclosure should be interpreted as being included in the scope of the present disclosure.

What is claimed is:

1. A display device comprising:
   a display panel including a plurality of sub-pixel areas for respectively outputting light for displaying an image; and
   a light travel-direction changing layer disposed on the display panel for diversifying and spreading travel directions of the light emitted from each of the plurality of sub-pixel areas,
   wherein the display panel includes:
      a support substrate;
      a transistor array disposed on the support substrate;
      a light-emitting array disposed on the transistor array; and
      an encapsulation film disposed on the light-emitting array,
   wherein the light travel-direction changing layer includes:
      a plurality of refractive patterns disposed on the encapsulation film respectively corresponding to the plurality of sub-pixel areas and arranged in a matrix form, the plurality of refractive patterns being spaced apart from each other on the encapsulation film; and
      a light-scattering layer disposed around each of the plurality of refractive patterns and having a refractive index different from a refractive index of each of the plurality of refractive patterns,
   wherein the light-scattering layer includes a transparent resin material and particles dispersed in the transparent resin material, the light-scattering layer disposed between adjacent refractive patterns,
   wherein the particles encounter the light refracted at a boundary between the refractive pattern and the light-scattering layer and scatter the light refracted in diversifying travel direction; and
   wherein the transparent resin material is in direct contact with an outer surface of the refractive patterns and with the encapsulation film between adjacent refractive patterns,
   wherein each refractive pattern includes a light incident face and a light-emission face opposite to the light incident face,
   wherein each refractive pattern is configured in a column shape in which the light incident face and the light-emission face are parallel to each other,
   wherein each refractive pattern includes side faces between the light incident face and the light-emission face, the side faces including a first side face and a second side face opposite to the first side face,
   wherein the first side face is formed as a plane perpendicular to the light incident face, causing the light emitted through the first side face from the light incident face to be refracted at an angle adjacent to the light-emission face,
   wherein the second side face is formed as an inclined face with respect to the light incident face, causing the light emitted through the second side face from the light incident face to be refracted at an angle away from the light-emission face, and
   wherein the first side face of one refraction pattern is disposed facing the second side face of an adjacent refraction pattern.

2. The display device of claim 1, wherein a light incident face of each of the plurality of refractive patterns has a width larger than a width of each of the plurality of sub-pixel areas.

3. The display device of claim 1, wherein a light-emission face of each of the plurality of refractive patterns has substantially a same shape as a shape of each of the plurality of sub-pixel areas in a plan view of the display device.

4. The display device of claim 1, wherein a light incident face of each of the plurality of refractive patterns has substantially a same shape as a shape of each of the plurality of sub-pixel areas in a plan view of the display device.

5. The display device of claim 1, wherein the refractive index of the light-scattering layer is lower than the refractive index of each of the plurality of refractive patterns.

6. The display device of claim 1, wherein the light-scattering layer covers a light-emission face of each of the plurality of refractive patterns such that a top face of the light-scattering layer is planarized.

7. The display device of claim 1, wherein the light-emitting array including a plurality of light-emissive elements respectively corresponding to the plurality of sub-pixel areas, wherein each light-emissive element emits the light from each sub-pixel area,
    wherein a light-emission face of each refractive pattern has substantially a same shape as a shape of each light-emissive element of each sub-pixel area corresponding to each refractive pattern, and has a larger width than a width of each light-emissive element.

\* \* \* \* \*